(12) United States Patent
Malone

(10) Patent No.: US 12,439,569 B2
(45) Date of Patent: Oct. 7, 2025

(54) SHIFT PUMP FLOW SCHEME

(71) Applicant: Cooper-Standard Automotive Inc., Northville, MI (US)

(72) Inventor: David S. Malone, Attica, MI (US)

(73) Assignee: Cooper-Standard Automotive, Inc., Northville, MI (US)

( * ) Notice: Subject to any disclaimer, the term of this patent is extended or adjusted under 35 U.S.C. 154(b) by 207 days.

(21) Appl. No.: 18/207,534

(22) Filed: Jun. 8, 2023

(65) Prior Publication Data
US 2023/0403833 A1 Dec. 14, 2023

Related U.S. Application Data

(60) Provisional application No. 63/351,526, filed on Jun. 13, 2022.

(51) Int. Cl.
| | |
|---|---|
| *H05K 7/20* | (2006.01) |
| *F01P 3/12* | (2006.01) |
| *F01P 5/10* | (2006.01) |
| *F01P 5/12* | (2006.01) |
| *H01M 6/50* | (2006.01) |

(52) U.S. Cl.
CPC ............ *H05K 7/20872* (2013.01); *F01P 3/12* (2013.01); *F01P 5/12* (2013.01); *F01P 2005/105* (2013.01); *F01P 2050/24* (2013.01); *H01M 6/5038* (2013.01)

(58) Field of Classification Search
CPC ... F01P 2005/105; F04D 15/0072; F04D 1/10
See application file for complete search history.

(56) References Cited

U.S. PATENT DOCUMENTS

| | | | |
|---|---|---|---|
| 9,961,804 B2* | 5/2018 | Hayashi | H05K 7/20154 |
| 2005/0180105 A1* | 8/2005 | Matsushima | H01L 23/473 |
| | | | 257/E23.098 |
| 2012/0132394 A1* | 5/2012 | Oberti | B60K 11/02 |
| | | | 165/51 |
| 2021/0391588 A1* | 12/2021 | Won | H01M 8/04417 |

* cited by examiner

*Primary Examiner* — Lionel Nouketcha
(74) *Attorney, Agent, or Firm* — Paschall & Associates, LLC; James C. Paschall; Anthony Miologos

(57) ABSTRACT

A process and apparatus for cooling a heat generating component of a vehicle comprises a first pump switchable between a normal demand mode and a high demand mode. Coolant is pumped from the first pump through a cooling loop between a heat dissipating device and the heat generating component at a normal demand flowrate in the normal demand mode. Switching the first pump to the high demand mode diverts the coolant to a second pump. The second pump pumping the coolant through the cooling loop at a high demand flowrate.

20 Claims, 5 Drawing Sheets

SHIFT PUMP FLOW SCHEME

FIELD

The field is generally related to a pump for shifting the flowrate of coolant to heat generating or absorbing components.

BACKGROUND

Pumps are known and commonly used to move fluids, such as coolant in a vehicle. One example is cooling systems with water pumps, which are used for the cooling of different electrical or mechanical components of a vehicle. In hybrid or purely electric vehicles, where electrical components need to be cooled, valves are used to ensure the distribution of the coolant throughout the cooling system. The valves each require an actuator with electrical control and a bracket to mount the valve and actuator on a component of the vehicle, which results in high component costs.

Normal use needs of a vehicle typically require a pump to furnish a minimum flowrate to meet cooling demands for normal driving or mild environmental conditions. However, in certain operating situations such as in performance driving, pulling a heavy trailer up a steep incline or during extreme environmental conditions a higher coolant flowrate must be furnished to properly cool the vehicles heat-generating components. To meet different cooling demands pumps are run at various speeds. When flowrate needs are low, pumps are run slower with ineffective pressure and when flowrate needs are higher pumps are run faster, with inefficient use of energy. It is an object of the present disclosure to employ a pump that can shift flowrate to meet the cooling needs for all driving and environmental conditions.

SUMMARY

This disclosure relates to a process for cooling a heat generating component of a vehicle comprising a first pump switchable between a normal demand mode and a high demand mode. Pumping coolant from the first pump through a cooling loop between a heat dissipating device and the heat generating component at a normal demand flowrate in the normal demand mode. Switching the first pump to divert the coolant to a second pump in the high demand mode and pumping the coolant from the second pump through the cooling loop between the heat dissipating device and the heat generating component at a high demand flowrate.

The disclosure also relates to an apparatus for cooling a heat generating component of a vehicle comprising a coolant loop containing a heat dissipating device and the heat generating component. A first pump circulates a coolant through the coolant loop between the heat dissipating device and the heat generating component at a normal demand flowrate. A second pump is fluidically connected to the first pump. The first pump is switchable to divert the coolant from the coolant loop to the second pump. The second pump circulating the coolant through the coolant loop between the heat dissipating device and the heat generating component at a high demand flowrate.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

The Figures, discussed below, and the various embodiments used to describe the principles of the present disclosure in this patent document are by way of illustration only and should not be construed in any way to limit the scope of the invention. Those skilled in the art will understand that the principles of the invention may be implemented in any type of suitably arranged device or system.

Figure 1:
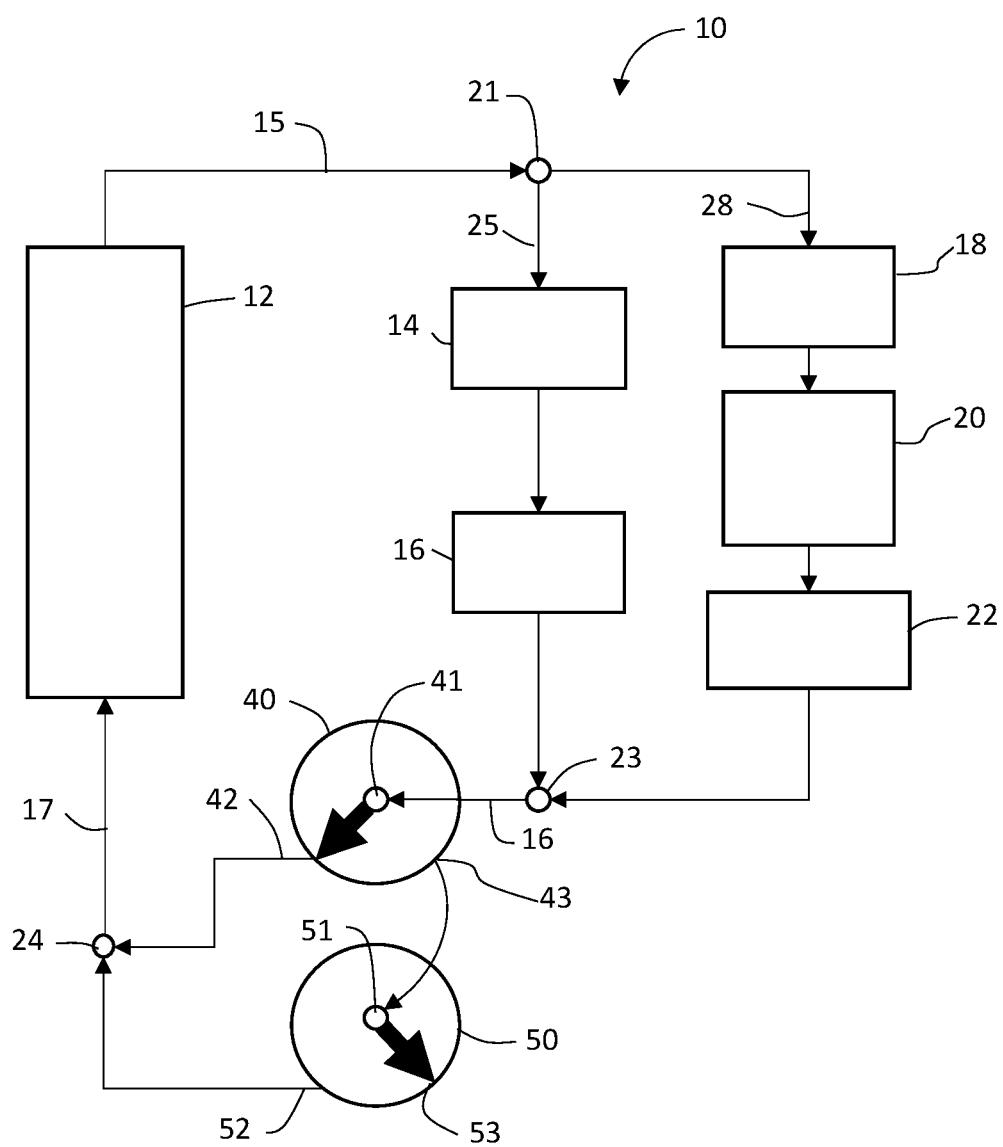
FIG. 1 illustrates a schematic view of a system of the present disclosure.

FIG. 1 depicts a thermal management system 10 for regulating the temperature of the heat generating components of a vehicle. The system 10 uses a coolant loop containing coolant fluid to maintain a desired temperature condition of both the charging and power train of an electric vehicle. The coolant loop is fluidically connected to a heat dissipating device 12 such as for example, a heat exchanger or a radiator cooled by a fan. The heat dissipating device 12 is used to cool the heat absorbed from the various heat producing components of the electric vehicle such as for example, a high voltage to low voltage DC converter 14, a battery charger 16, a DC to AC electrical inverter 18, a drive unit 20 containing an electrical motor that drives the wheels of the vehicle and a transmission oil cooler 22. It should be noted that the electric vehicle may contain other heat producing components that may be managed by the thermal management system 10 and the components listed herein show only a simplified system for better understanding of the disclosure.

The heat generating components may be connected to the coolant loop along branch loops according to function. For example, the coolant loop may include a charger branch loop branching off junction 21 along a coolant line 25 downstream from a first main coolant line 15. The charger branch loop contains the DC converter 14 and the battery charger 16. A separate drive branch loop extends downstream from junction 21 along cooling line 28 that contains the components that drive the wheels of the vehicle. For example, the electric inverter 18, the drive unit 20 and the transmission oil cooler 22. The cooling lines 25 and 28 of the charger branch loop and the drive branch loop respectively, rejoin at junction 23. The system 10 further includes a first pump 40 and a second pump 50 used to pump coolant through the coolant loop. A second main coolant line 16 fluidically connected to junction 23 collects the coolant from coolant lines 25 and 28 and applies the collected coolant to the inlet 41 of a first pump 40.

The first pump 40 has two outlets and is switchable between two modes, a normal demand mode and a high demand mode. When the first pump 40 is in the normal demand mode a first valve in the first pump 40 opens the first outlet 42 to discharge coolant from the first outlet 42 while the second outlet 43 is closed. The first pump 40 pumps coolant through the first outlet 42 to a third main coolant line 17 through a junction 24 to the heat dissipating device 12. In the normal demand mode first pump 40 pumps coolant through the coolant branch loops at a normal demand flowrate sufficient to manage the desired temperature condition of the charging and drive train branch loops. The first pump 40 uses a flowrate that circulates coolant through the system 10 designed for normal conditions such as for example, low or moderate external air temperatures and low demand driving conditions. Since the first valve in pump 40 directs all coolant to first outlet 42, no coolant flows to the inlet 51 of the second pump 50 from the second outlet 43. In the normal demand mode pump 50 is isolated from the coolant loop and does not contribute to the flowrate of the coolant circulating in the system 10.

However, in extreme conditions such as when operating at elevated environmental temperatures, and or extreme driving conditions such as higher sustained speeds, and or the extreme loading conditions such as hauling or towing heavy loads up steep inclines the flowrate provided by first pump 40 would not be sufficient to cool the vehicles heat generating components.

Figure 2:
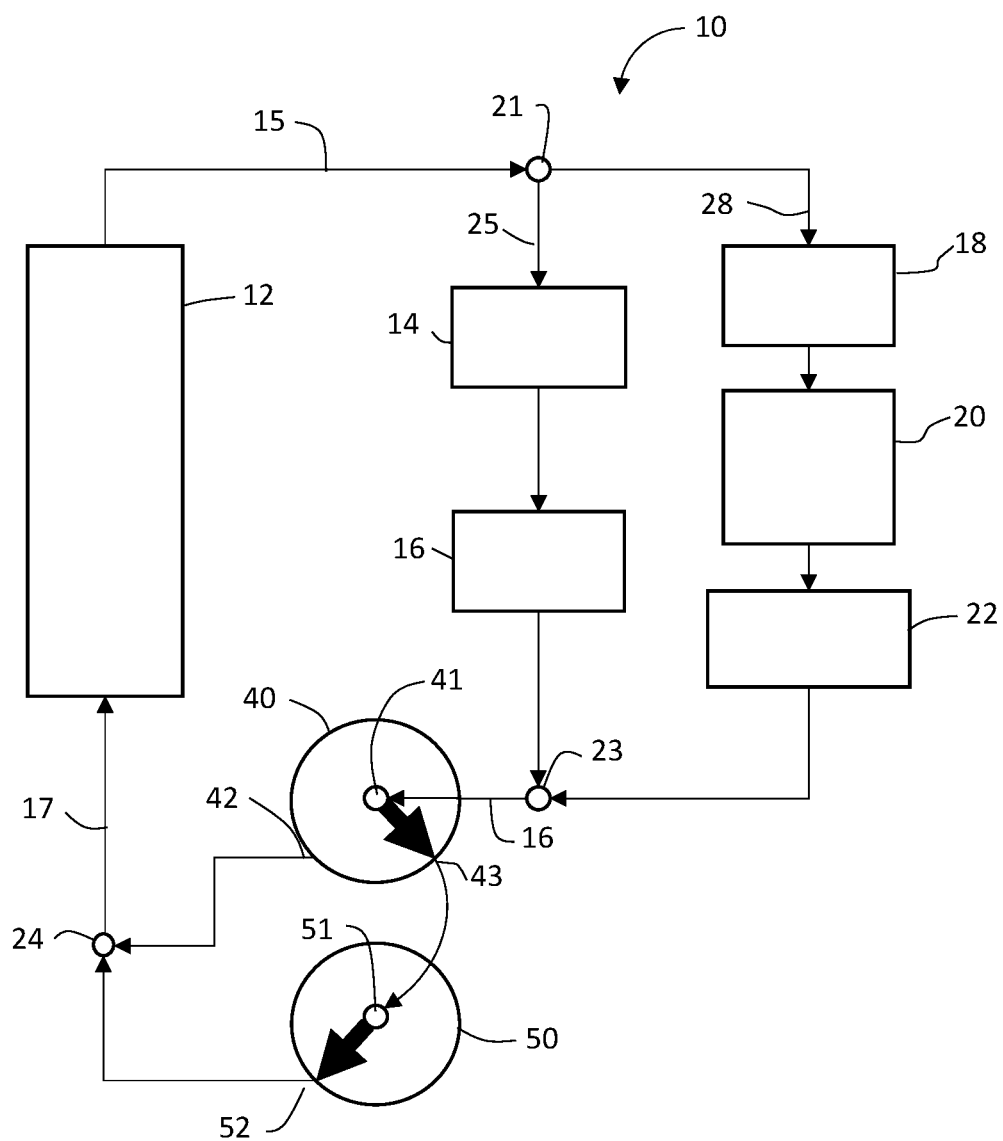
FIG. 2 illustrates a schematic view of a system of the present disclosure.

When conditions warrant that the vehicle's thermal management system 10 switch to the high demand mode, the second pump 50 is shifted into the coolant loop to increase the flowrate of the coolant through the branch loops into a high demand flowrate. As is illustrated in FIG. 2, the first valve in first pump 40 is switched to the second outlet 43 closing first outlet 42. Second outlet 43 applies the coolant pumped by first pump 40 to the inlet 51 of the second pump 50. At the same time, the second valve in pump 50 is switched from a closed position 53 to a third outlet 52. In the high demand mode second pump 50 receives the coolant from the first pump 40 at the normal demand flowrate. The second pump 50 shifting the received normal demand flowrate to the high demand flow rate. Coolant at the increased shifted high demand flowrate exits second pump 50 at third outlet 52 at approximately twice the flowrate provided by first pump 40 to inlet 51. The high demand flowrate is applied to junction 24 and to the third main coolant line 17 to the heat dissipating device 12 for circulation through the system 10.

When the vehicle returns to normal driving conditions the system 10 returns to the normal demand mode. The first valve in the first pump 40 opens to discharge coolant from the first outlet 42, closing the second outlet 43 and preventing coolant from flowing to the second pump 50. Additionally, the second valve in second pump 50 is switched to the closed position 53 blocking coolant from exiting pump 50. The pump 40 resumes pumping coolant through the first outlet 42 to return line 17 and back to the heat dissipating device 12 at the normal demand flowrate as illustrated in FIG. 1.

Figure 3:
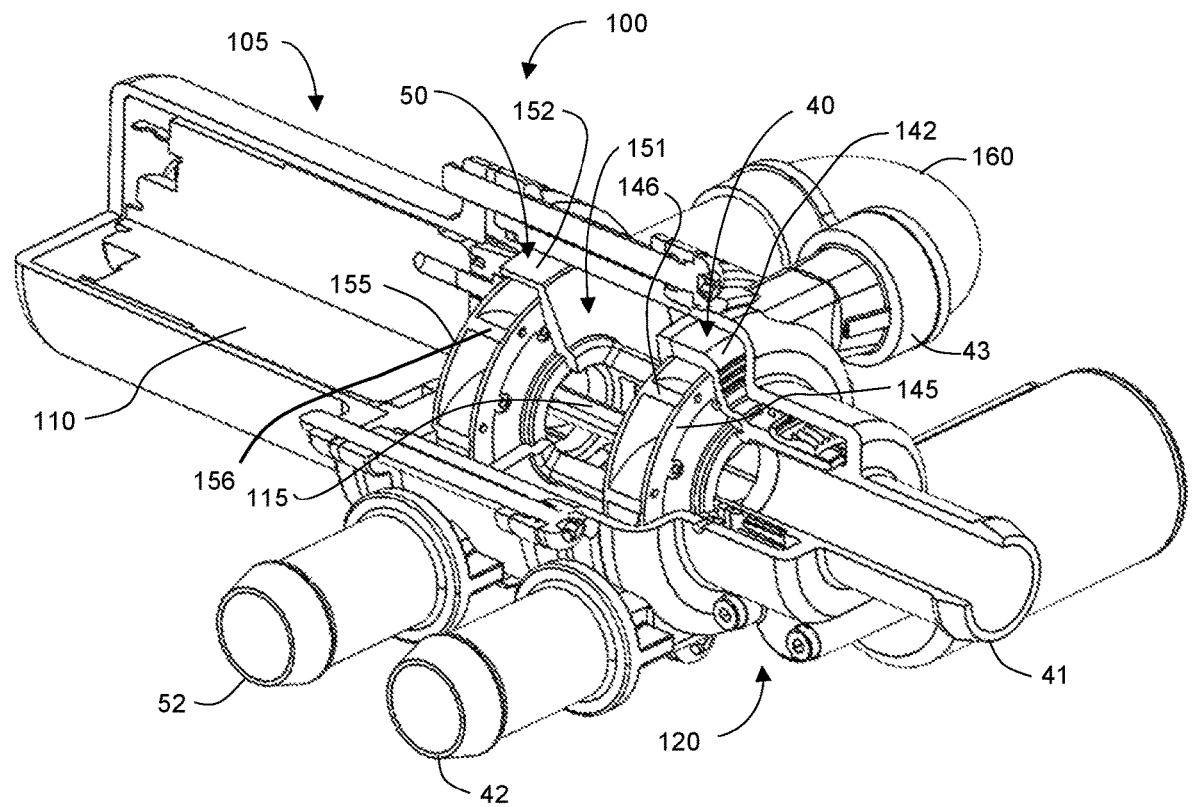
FIG. 3 illustrates a cross-sectional perspective view of an example multifunctional pump assembly of the present disclosure.

FIG. 3 illustrates an example of a multifunctional pump assembly 100 that incorporates first pump 40 and second pump 50 and their associated valves into an integrated unit for selectively shifting the coolant flowrate of the thermal management system 10. As can be appreciated, the first pump 40 and the second pump 50 may also be used in non-vehicle applications. The multifunctional pump assembly 100 comprises a pump motor section 105, having an electric motor 110, and a rotating motor shaft 115 extending from the motor 110 into a pump section 120. Pump section 120 houses the first pump 40 and second pump 50. The first pump 40 is comprised of an impeller 145 having a plurality of impeller vanes 146 that drive the coolant and a first valve 142 rotatable about impeller 145. The second pump 50 is comprised of an impeller 155 having a plurality of impeller vanes 156 and a second valve 152 rotatable about impeller 155. An inlet 41, a first outlet 42, a second outlet 43 and third outlet 52 are disposed about the pump section 120. An inlet chamber 151 is located between impeller 155 and 145. The inlet chamber 151 is fluidically connected to impeller 155 and acts as the inlet 51 for pump 50. Inlet camber 151 however is fluidically isolated from the impeller 145 and inlet 41 of the first pump 40. The inlet chamber 151 is fluidically connected to first pump 40 second outlet 43 via a bypass port 160. Impeller vanes 146 of the first pump 40 and impeller vanes 156 of the second pump 50 are both attached to the motor shaft 115 and rotatable within the pump section 120 driven by the motor shaft 115 at an identical and constant rotational speed. The pump motor 110 includes electrical connections (not shown) that are adapted to receive electrical power from a remotely located power source to energize and operate the pump motor.

Figure 4A:
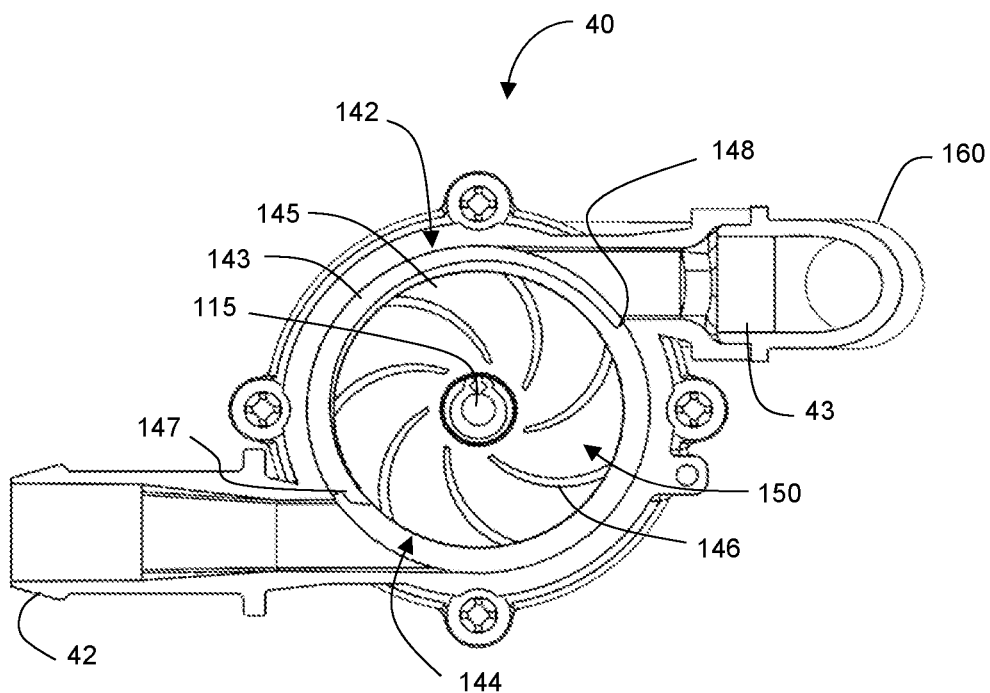
FIG. 4A illustrates a cross-section view through a portion of the first pump and first valve of the multifunctional pump assembly of FIG. 3 of the present disclosure.

Referring to FIG. 4A the fluid outlets 42, 43 are in downstream communication with a pump 40 cavity 150. An adjustable first valve 142 is radially located outside the impeller 145 and inside the pump cavity 150. The first valve 142 is arranged to adjustably direct the fluid through the respective first and second outlets 42, 43, respectively. The valve 142 has an annular wall 143 and an opening 144 extending through wall 143. In this example, wall 143 of the valve 142 is spirally voluted from a generally thicker wall section at a first end 147 of opening 144 to a generally thinner wall section at a second end 148 of the opening 144. The impeller 145 is arranged to rotate inside the annular wall 143.

Figure 4B:
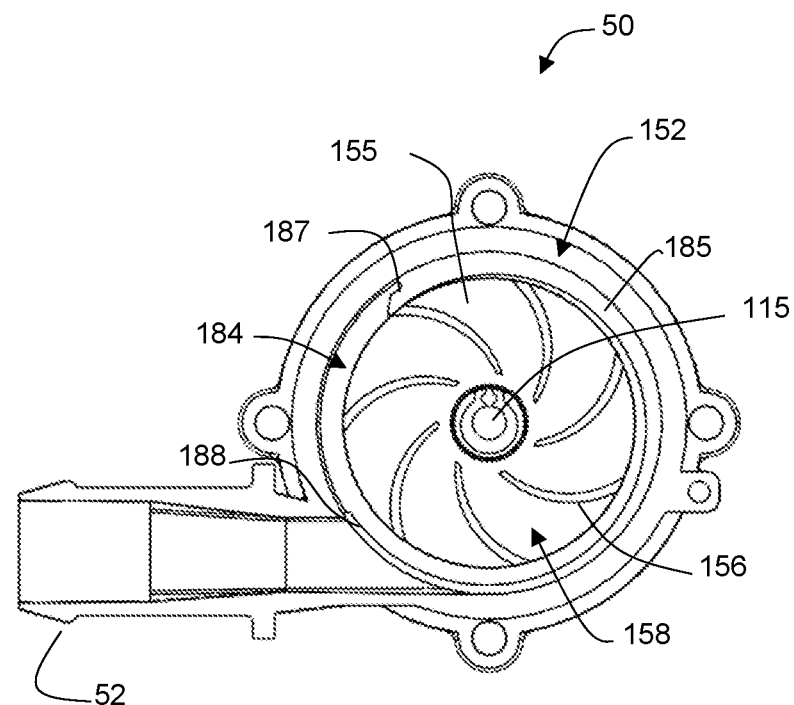
FIG. 4B illustrates a cross-section view through a portion of the second pump and second valve of the multifunctional pump assembly of FIG. 3 of the present disclosure.

An electrical actuator (not shown) selectively operates the valve 142 to block the second outlet 43 with wall 143. Coolant entering cavity 150 from inlet 41 is driven by impeller vanes 146 out of the first outlet 42 at the normal demand flowrate. Valve 142 is mechanically connected to valve 152. Rotation of valve 142 to block second outlet 43 also positions wall 185 of the valve 152 to close outlet 52 as shown in FIG. 4B. Pump cavity 158 of pump 50 receives coolant from inlet chamber 151 only when the second outlet 43 is open. In the normal demand mode wall 143 blocks the second fluid outlet 43 and no fluid is pumped into inlet chamber 151 from the first pump 40.

Figure 5A:
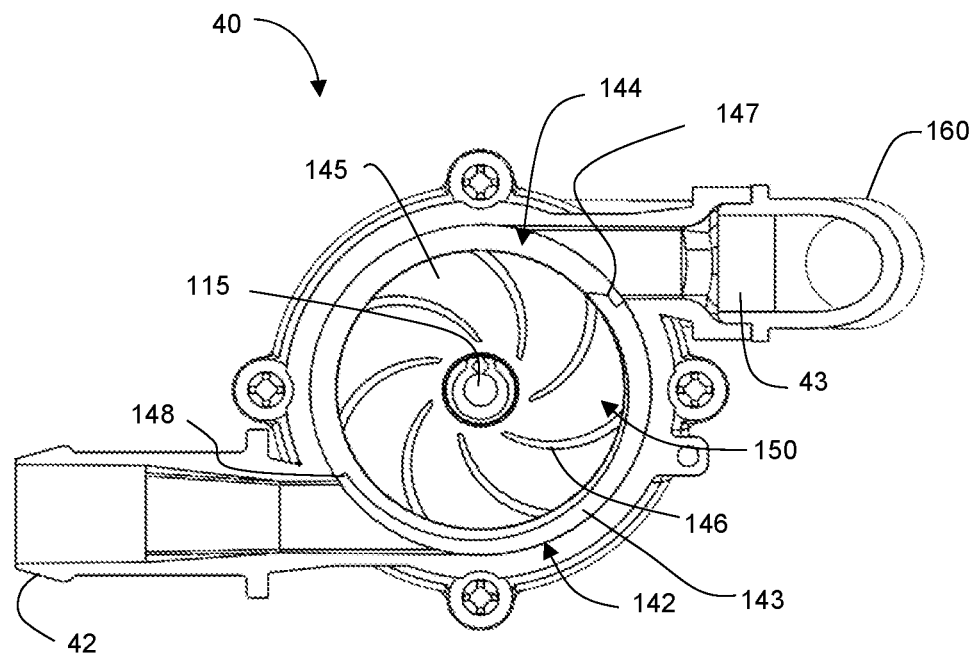
FIG. 5A illustrates a cross-section view through a portion of the first pump and first valve of the multifunctional pump assembly of FIG. 3 of the present disclosure.
Figure 5B:
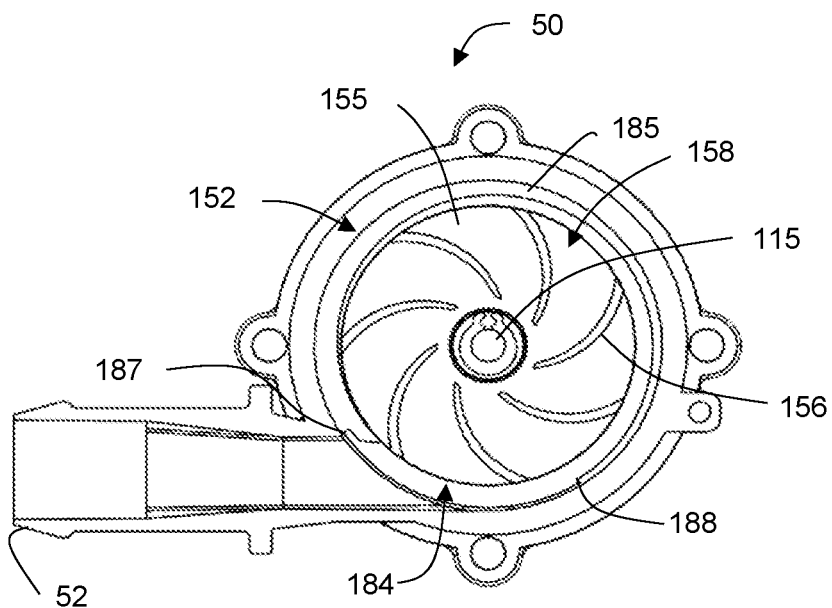
FIG. 5B illustrates a cross-section view through a portion of the second pump and second valve of the multifunctional pump assembly of FIG. 3 of the present disclosure.

When the high demand mode is selected due to the vehicle's demand for greater cooling the actuator positions valve 142 of first pump 40 to position wall 143 to block first outlet 42 and position opening 144 with second outlet 43, as is shown in FIG. 5A. Coolant driven by impeller vanes 146 is diverted at the normal demand flowrate from cavity 150 through opening 144 to the second outlet 43 and bypass loop 160 into inlet chamber 151 of second pump 50. Synchronously, when valve member 143 is positioned to align opening 144 to second outlet 43, valve member 152 positions opening 184 to align with outlet 52 as shown in FIG. 5B. The coolant in inlet chamber 151 enters pump cavity 158 and is driven by impeller vanes 156 through opening 184 and out of third outlet 52. Inlet chamber 151 receives the coolant at the first normal demand rate from first pump 40 and is shifted by the impeller vanes 156 of the second pump 50 into the high demand flowrate to be output from the third outlet 52.

Even though the present disclosure has been explained using two pumps, it will be appreciated by those skilled in the art that more than the two pumps may be used to shift the flowrate through the thermal management system 10. For example, a third and a fourth pump can be attached to the first and the second pump with each having inlet chambers, impellers and valve assemblies cascading downstream in pump stages from a first primary pump. Each pump stage providing an increased shift in the coolant flowrate to satisfy a vehicle's cooling demands. It will be further appreciated by those skilled in the art, that the last stage of such a multi-pump assembly would not require the last pump stage of the assembly to include a valve, since the last pump would not be required to switch its flow to the next downstream pump stage.

It may be advantageous to set forth definitions of certain words and phrases used throughout this patent document. The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," or "controller" within a claim is understood and intended to refer to structures known to those skilled in the relevant art, as further modified or enhanced by the features of the claims themselves and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A process for cooling at least one first heat generating component of a vehicle comprising:
   providing a first pump switchable between a normal demand mode and a high demand mode;
   pumping coolant from the first pump through a first cooling loop between a heat dissipating device and the first heat generating component at a first flowrate in the normal demand mode;
   switching the first pump to divert the coolant to a second pump in the high demand mode; and
   pumping coolant from the second pump through the cooling loop between the heat dissipating device and the at least heat generating component at a second flowrate that is greater than the first flowrate.

2. The process of claim 1, wherein the process further comprises:
   providing at least one second heat generating component connected to a second cooling loop;
   pumping coolant from the first pump through the first cooling loop and the second cooling loop between the heat dissipating device and the first and the second heat generating components at the first flowrate in the normal demand mode;
   switching the first pump to divert the coolant to a second pump in the high demand mode; and
   pumping coolant from the second pump through the first and the second cooling loops between the heat dissipating device and the first and the second generating components at the second flowrate.

3. The process of claim 2, wherein the first pump includes an inlet connected to the first and second coolant loops and a first valve located between the inlet and a first and a second outlet, the first valve movable between a first and a second position, the process further comprising:
   moving the first valve to the first position in the normal demand mode connecting the first outlet to the inlet, wherein the coolant is pumped from the first pump at the first outlet at the first flowrate.

4. The process of claim 3, wherein the first valve is moved to the second position in the high demand mode disconnecting the first outlet and connecting the second outlet to the inlet, wherein the coolant is pumped from the first pump to an inlet of the second pump at the first flowrate.

5. The process of claim 4, wherein the second pump includes a second valve located between the second pump inlet and an outlet connected to the first and second coolant loops, the second valve movable between a first position and a second position, wherein in the normal demand mode the second valve first position disconnects the second pump inlet from the outlet.

6. The process of claim 5, wherein the second pump second valve is moved to the second position in the high demand mode connecting the second pump inlet to the outlet, wherein the second pump receives the first flowrate from the first pump and shifts the first flowrate into the second flowrate pumping the coolant from the second pump outlet at the second flowrate.

7. The process of claim 6, wherein the first valve and the second valve move synchronously when positioned into the first and the second positions.

8. An apparatus for cooling a heat generating component of a vehicle comprising:
   a first coolant loop containing a heat dissipating device and at least one first heat generating component;
   a first pump for circulating a coolant through the first coolant loop between the heat dissipating device and the first heat generating component at a first flowrate; and
   a second pump fluidically connected to the first pump, the first pump switchable to divert the coolant from the coolant loop to the second pump,
   wherein the second pump circulates the coolant through the first coolant loop between the heat dissipating device and the first heat generating component at a second flowrate that is greater than the first flowrate.

9. The apparatus of claim 8, wherein the apparatus further includes:
   at least a second coolant loop containing at least one second heat generating component;
   a first pump for circulating a coolant through the first and second coolant loops between the heat dissipating device and the first and second heat generating components of the first and second coolant loops at the first flowrate; and
   a second pump fluidically connected to the first pump, the first pump switchable to divert the coolant from the first and second coolant loops to the second pump,
   wherein the second pump circulates the coolant through the first and second coolant loops between the heat dissipating device and the first and second heat generating components of the first and second coolant loops at the second flowrate.

10. The apparatus of claim 9, wherein the first pump includes an inlet connected to the first and second coolant loops and a first valve located between the inlet and a first and a second outlet, the first valve movable between a first and a second position, wherein the valve in the first position connects the first outlet to the inlet pumping the coolant from the first pump at the first flowrate.

11. The apparatus of claim 10, wherein in the high demand mode the first valve moves to the second position connecting the second outlet to the inlet, pumping coolant from the second outlet at the first flowrate.

12. The apparatus of claim 11, wherein the second pump includes a second valve located between an inlet to the second pump and an outlet connected to the first and second coolant loops, the second valve movable between a first position and a second position, wherein in the normal demand mode the second valve is in the first position disconnecting the second pump inlet from the outlet.

13. The apparatus of claim 12, wherein in the high demand mode the second pump second valve is moved to the second position connecting the inlet to the second pump to the outlet, wherein the second pump receives the first flowrate from the first pump and shifts the first flowrate into the high demand flow rate pumping the coolant at the second flowrate from the second pump outlet.

14. The apparatus of claim 13, wherein the first valve and the second valve are driven into the first and the second positions by an actuator.

15. The apparatus of claim 14, wherein the actuator is an electrical motor that synchronously drives the first and the second valves into the first and second positions.

16. The apparatus of claim 13, wherein the apparatus further includes a pump section, the pump section housing the first pump and the second pump within the pump section.

17. The apparatus of claim 16, wherein the apparatus further includes:
   a motor section having an electrical motor and a rotating motor shaft extending from the motor section into the pump section, the motor shaft connected to a first impeller located in the first pump and to a second impeller located in the second pump.

18. The apparatus of claim 17, wherein the motor shaft rotates the first impeller and the second impeller at a constant rotational speed.

19. The apparatus of claim 17, wherein the pump section includes an inlet chamber located in the pump section, and in the first valve first position the first impeller pumps the coolant from the inlet of the first pump to the first outlet at the first flowrate and in the first valve second position the first impeller pumps the coolant from the second outlet to the inlet chamber at the first flowrate.

20. The apparatus of 19, wherein in the second valve second position the second impeller pumps the coolant in the inlet chamber to the second pump outlet at the second flowrate.

* * * * *